(12) United States Patent
Tanwani et al.

(10) Patent No.: US 12,106,685 B2
(45) Date of Patent: Oct. 1, 2024

(54) ANTI-TAMPER DEVICE, ENCLOSURE FOR A UTILITY METER AND SAME

(71) Applicant: Landis+Gyr AG, Cham (CH)

(72) Inventors: Nikhil Tanwani, Delhi (IN); Bahadur Singh Rathore, Noida (IN); Panagiotis Syfalakis, Peterborough (GB)

(73) Assignee: Landis+Gyr AG, Cham (CH)

( * ) Notice: Subject to any disclaimer, the term of this patent is extended or adjusted under 35 U.S.C. 154(b) by 251 days.

(21) Appl. No.: 17/625,274

(22) PCT Filed: Jul. 9, 2020

(86) PCT No.: PCT/EP2020/069316
§ 371 (c)(1),
(2) Date: Jan. 6, 2022

(87) PCT Pub. No.: WO2021/005136
PCT Pub. Date: Jan. 14, 2021

(65) Prior Publication Data
US 2022/0262277 A1 Aug. 18, 2022

(30) Foreign Application Priority Data

Jul. 11, 2019 (EP) ..................................... 19386032

(51) Int. Cl.
*G09F 3/03* (2006.01)
*G01R 1/04* (2006.01)
*G01R 11/24* (2006.01)

(52) U.S. Cl.
CPC .............. *G09F 3/0311* (2013.01); *G01R 1/04* (2013.01); *G01R 11/24* (2013.01)

(58) Field of Classification Search
CPC . G09F 3/00; G09F 3/03; G09F 3/0305; G09F 3/0311; G01R 1/00; G01R 1/02;
(Continued)

(56) References Cited

U.S. PATENT DOCUMENTS

| 2012/0236472 A1* | 9/2012 | Nahar | G01R 11/04 |
| | | | 361/659 |
| 2013/0088353 A1* | 4/2013 | LaFrance | G01R 11/24 |
| | | | 340/551 |

FOREIGN PATENT DOCUMENTS

| EP | 0035323 A1 | 9/1981 |
| EP | 0988556 B1 | 2/2003 |

(Continued)

OTHER PUBLICATIONS

International Search Report and Written Opinion, PCT Patent Application No. PCT/EP2020/069316, Aug. 21, 2020, 16 pages.

*Primary Examiner* — Nathan Cumar
(74) *Attorney, Agent, or Firm* — Kilpatrick Townsend & Stockton LLP

(57) ABSTRACT

An anti-tamper device for a utility meter, in particular for an enclosure thereof, providing a guideway for a sealing element, wherein in a sealed state of the utility meter, at least a section of the sealing element extends along the guideway. Furthermore, an enclosure for a utility meter comprising a socket configured for receiving an anti-tamper device, as well as a utility meter comprising an anti-tamper device, and/or an enclosure. The guideway is provided with a predetermined breaking zone configured to break when the sealing element exerts a predefined breaking force onto the anti-tamper device.

13 Claims, 10 Drawing Sheets

(58) Field of Classification Search
CPC ...... G01R 1/04; G01R 1/0408; G01R 1/0416; G01R 11/00; G01R 11/02; G01R 11/04; G01R 11/24
USPC ..................................................... 292/307 R
See application file for complete search history.

(56) References Cited

FOREIGN PATENT DOCUMENTS

| | | | | |
|---|---|---|---|---|
| GB | 2334338 A * | 8/1999 | ............. | G01R 11/04 |
| KR | 101201955 B1 | 11/2012 | | |
| WO | 2009/059386 A2 | 5/2009 | | |
| WO | WO-2014116241 A1 * | 7/2014 | ................ | F16B 2/08 |
| WO | WO-2018017126 A1 * | 1/2018 | ............. | B65D 27/30 |
| WO | WO-2019077428 A1 * | 4/2019 | ............... | G01D 4/02 |

* cited by examiner

ANTI-TAMPER DEVICE, ENCLOSURE FOR A UTILITY METER AND SAME

The present invention relates to an anti-tamper device for a utility meter, to an enclosure for a utility meter, and to a utility meter with a respective anti-tamper device and/or enclosure.

TECHNOLOGICAL BACKGROUND

Utility meters, for example electricity meters, are known from the prior art and serve for determining an amount of consumption of a medium, like water or gas, or of electrical energy supplied. In order to connect the utility meter to a power supply or to a source of electrical energy to be supplied and metered, utility meters comprise conductor connection devices including terminals configured to take up bared ends of electrical lines delivering the electrical energy. For measuring the consumption as well as for communicating over wired and wireless connections, the utility meters comprise electrical circuits, for example provided on and as printed circuit boards. Furthermore, the utility meters comprise control elements, like displays, push buttons, switches and alike, so that they may be controlled, adjusted and operated by respective operators, like e.g. personnel installing and maintaining the utility meters.

The terminals, electrical circuits and control elements on the one hand need to be protected against harmful environmental impacts, like dust, moisture, and alike, as well as against tampering. On the other hand, customers of the electrical energy as well as operators need to be protected against electrical shock from the electrical lines. Therefore, the terminals, electrical circuits and control elements are housed in by means of enclosures. These enclosures are commonly comprised of several parts. For example, a terminal cover part is formed and arranged to cover the terminals such that they can be accessed only by an admitted professional operator. An exterior cover part is formed and arranged so that it protects electrical circuits and may provide access to the control elements at a front side of the utility meter. A base part is provided to at least partly enclose the terminals, electrical circuits and control elements at a back side the utility meter, and commonly also serves for mounting the utility meter to in an electric cabinet or to a wall of a building or construction where the utility meter is installed.

According to the prior art, tamper protection is commonly achieved by using sealing means, such as wires, extending through a base part and a cover part of the enclosure of the electricity meter, and being provided with a wire seal, so that breaking of the wire seal indicates a tamper attempt.

Another way to provide tamper protection, as applied by the applicant of the present disclosure, makes use of a pushbutton which is to be inserted into a socket formed in the front face of an electricity meter, e.g. the E450 meter manufactured by the applicant. The push button knob may activate an electrical switch for enabling and/or disabling certain meter controls which shall remain reserved for authorised personnel. Therefore, the pushbutton knob is provided with a trigger or actuating element preferably arranged at the end of a shaft which can actuate the switch upon pushing the push button knob. The push button knob is secured in a locking position by means of a wire seal extending through a passage formed in the cover and a through-hole formed in the pushbutton knob, so that a rotation of the push button knob out of the locking position is prevented.

Furthermore, EP 0 035 323 describes an electricity meter provided with means for detecting unauthorised attempts to gain access to the interior of the meter. The detecting means typically comprises an optical path or an electrically conducting path which is arranged to be broken by such attempts. In one embodiment, the path is formed by a filamentary member used to seal a bolt holding on the meter case or cover, while in further embodiment, the path is broken by the removal of the meter cover or the terminal cover. In either embodiment, a further path may be formed in or on the surface of the meter cover so as to be broken if the cover is broken or drilled.

EP 0 988 556 B1 an electro-mechanical electricity consumption meter of a type having a sealed housing to prevent tamper therewith. The meter includes a rotatable component which is visible through a portion of the sealed housing and whose rate of rotation is related to the rate of consumption of electricity. The component has at least one marking on a surface thereof such that the rate of rotation of the component can be determined using a monitoring assembly located outside the sealed housing through a transparent region of the sealed housing without the need to access the interior of the meter. A removable sealable cover structure is disposed over a portion of the sealed housing other than the said transparent region, and in conjunction with the sealed housing provides a volume in which an optical monitoring assembly can be housed externally of and relative to the sealed housing so as to view the part or component through the sealed housing from under the cover structure.

GB 2 334 338 describes an apparatus for detecting tamper in an electro-mechanical electricity consumption meter of a type having a sealed housing. The apparatus comprises a module 11 which can be fitted outside the sealed housing of the meter and enclosed by the sealable terminal cover. The module includes electrical circuit means which is operable to detect tamper to the meter. Preferably, the module includes an optical pick-up for detecting rotation of the rotatable component through the sealed housing and the electrical circuit means is operable to detect for reverse rotation of the rotatable component indicating the meter is being tampered with.

KR 10 1201955 B1 relates to an automatic meter reading system for blocking or controlling power supply when a faulty state including high temperature heat generation occurs A micro switch unit is installed at a main cover or a terminal cover. The micro switch unit generates and records an event when a sealing unit is opened or dissolved. A magnetic sensor unit senses if an accumulation of electrical power is interrupted. When a tamper alarm unit receives a sensing signal from the magnetic sensing unit, the tamper alarm unit generates an alarm through the buzzer or the display panel. A memory stores event information and the alarm.

WO 2009/059386 A2 describes a system for detecting and preventing power theft on a branch distributor conduit between a transformer/distribution circuit and an electricity meter. The system comprises first sensors and a first converter unit located within a sealed box of an electricity meter at the customer for determining a first current value representing the current in the power feeding cables and second sensors and a second converter located within a connection box measuring a second current value representing the current in the branch distributor conduit. The connection box comprises further a first electronic unit which determines the difference between the said first current value and the said second current value. If the difference is above a threshold value, power theft is determined, and a signal is transmitted from the first electronic unit to a server located in the power distribution company for registering power theft.

Means for tamper protection as known from the prior art have the disadvantage that locking mechanisms and corresponding seals used for preventing access to an interior space of the respective electricity meters may often be manipulated such that a tamper attempt may not be detected. For example, respective locking means may be removed after breaking a seal, such as a wire seal, for then accessing the interior of the meter, and afterwards replacing the broken seal with a counterfeited one or repairing the seal such that the tamper attempt is not clearly evident.

Moreover, electrical mechanisms for signalising a tamper attempt may be circumvented by bridging or short-circuiting electrical components involved. Such electrical components may also fail in that they give false alarms, which may particularly be the case for microswitches which may give false electrical signals due to ageing, environmental impacts, such as vibration, dust, moisture, or alike. Same holds true for optical components.

These disadvantages lead to that on the one hand, tamper attempts may not be detected, and a tampering event may have taken place without being noticed. On the other hand, the costs and efforts for implementing more sophisticated, e.g. optical and/or electronic systems for tamper detection lead to an unwanted increase of manufacturing and maintenance costs for electricity metes.

DESCRIPTION OF THE INVENTION

It is an object of the present invention, to at least partly mitigate some of the above-mentioned disadvantages of sealing means and enclosures for utility meters known from the prior art. In particular, an object underlying the invention is to provide a cost-effective way of sealing electricity meter such that any tamper attempt can be detected and any tampering with the electricity meter as well as unauthorised access to critical component of the electricity meter can be prevented.

For an above-mentioned anti-tamper device, these objects are at least partly achieved in that the anti-tamper device provides a guideway for a sealing element, wherein in a sealed state of the utility meter, at least a section of the sealing element extends along the guideway. In a preferred embodiment, the sealing element extends along the entire length of the guideway. The guideway is provided with a predetermined breaking zone configured to break when the sealing element exerts a predefined breaking force onto the anti-tamper device.

For an above-mentioned enclosure, these objects are at least partly achieved in that it comprises a socket configured for receiving an anti-tamper device according to the present invention.

For a utility meter, these objects are at least partly achieved in that it comprises an anti-tamper device according to the present invention, and/or an enclosure according to the present invention.

Thereby, of a predefined force is transmitted to the anti-tamper device from the sealing element, the anti-tamper device itself breaks at the predefined breaking zone and therefore indicates a tamper attempt. Moreover, in breaking, the anti-tamper device may prevent that it is being removed, such that the sealed state of the utility meter can be maintained. For example, the sealing element may be embodied as at least 1 of a wire seal, a strap, a bolt, a pin, or alike. Predetermined breaking zones may comprise at least one of a predetermined breaking point, numerous points aligned to each other, or an area or combination thereof, such that the anti-tamper device breaks in a manner that a tamper attempt is indicated and an unauthorised access to critical components inside of the utility meter is prevented for any unauthorised personnel. Therefore, the predetermined breaking zone may comprise any kind of notch, groove, weakening, a change of material, or alike, to facilitate a breaking or at least visible and/or tactile damaging of the anti-tamper device.

This has the decisive advantage over the prior art that most likely, any tamper attempt can be detected because the anti-tamper device cannot be repaired or replaced by unauthorised personnel. Even if the sealing element remains intact, the anti-tamper device is broken or damaged and thereby clearly indicates the tamper attempt. When the anti-tamper device maintains the sealed state even if broken or damaged at the predetermined date breaking zone, it continues securing the electricity meter and thus prevents unauthorised access to critical components of the electricity meter.

Unless explicitly stated to the contrary, the solutions according to the invention can be combined as desired and further improved by the further following embodiments that are advantages on their own, in each case. A skilled artisan will readily recognise that any apparatus features of an anti-tamper device, an enclosure for a utility meter as such or a utility meter according to the present invention can be easily implemented as method steps as well as features of embodiments of a method according to the present invention, and vice versa.

According to a possible embodiment, the anti-tamper device is configured to be attached to the utility meter in a securing position of the anti-tamper device. By attaching the anti-tamper device to the utility meter in a securing position, the anti-tamper device may be captively held at the electricity meter. Thereby, unauthorised removal of the anti-tamper device from the electricity meter can be prevented.

According to a possible embodiment, a predefined retention force with which the anti-tamper device withstands removal from the securing position is greater than the breaking force. In the securing position, the anti-tamper device can mechanically prevent unauthorised access to critical components of the electricity meter, e.g. by locking parts of the enclosure of the electricity meter such that critical components of the electricity meter may not be accessed from outside. Furthermore, in the securing position, the anti-tamper device may actuate an actuator, such as a switch of the utility meter, or alike, to mechanically as a sure electronically indicating that the utility meter is in a sealed state.

The anti-tamper device can be attached to the utility meter in such manner that the predefined retention force is greater than the breaking force. If then, an attempt is made to remove the anti-tamper device from the securing position by applying a force to the sealing element which is greater than the breaking force, the predefined breaking zone breaks or is as least damaged, such that the anti-tamper device remains retained at the utility meter, but still a tamper attempt can be detected.

According to a possible embodiment, the anti-tamper device further comprises a mounting portion configured to be brought into engagement with the utility meter in the securing position. By bringing the mounting portion into engagement with utility meter, the anti-tamper device can be attached thereto and retained at the utility meter in a desired manner. The mounting portion can be configured such that it provides the retention force that prevents unauthorised removal of the anti-tamper device from the securing position.

According to a possible embodiment, the mounting portion extends away from the predetermined breaking zone. In other words, the mounting portion and the predetermined breaking zone may be arranged at opposite sides of the anti-tamper device. Thereby, a part of the anti-tamper device comprising the predetermined breaking zone may be arranged accessible from the outside of the utility meter, while the mounting portion can be arranged such that it is at least in part inaccessible from the outside of the utility meter, or otherwise hidden in such a manner that it is not easily accessible by unauthorised personnel. This helps to restrict any tamper attempts or efforts to manipulate the anti-tamper device to parts thereof comprising the predetermined breaking zone which then reliably indicates an actual tamper attempt or any other event of manipulation, in particular in relation to forces applied to the sealing element.

According to a possible embodiment, the mounting portion provides at least one holding surface at least partly extending under an acute angle with respect to a longitudinal axis of the mounting portion. The at least one holding surface may be formed at a mounting means arranged at an end region of a leg of the mounting portion, and can be configured to create a positive fit and/or force fit when the mounting means are brought into engagement with any part of the utility meter, e.g. a base thereof, or to a structure to which the utility meter is mounted, such that a removal of parts of the utility meter, e.g. its cover, and/or of the entire utility meter, is prevented.

By providing the holding surface with an acute angle with respect to the longitudinal axis of the mounting portion, the disengagement of the mounting portion and respective other parts of the utility meter or structures can be prevented. The at least one holding surface can be arranged at the anti-tamper device such that it is inaccessible from outside of the electricity meter in the securing position of the anti-tamper device. This helps in further preventing unauthorised removal of the anti-tamper device from the securing position.

According to a possible embodiment, the mounting portion provides a latching element configured to snap behind a counter latching element provided at the utility meter in the sealed state. The at least one holding surface can be arranged at the latching element. When the latching element snaps behind a counter latching element provided at the utility meter, the at least one holding surface overlaps with the counter latching element in a projection along the longitudinal axis of the mounting portion in order to provide the desired retention force holding the anti-tamper device in the securing position. By providing the latching element, the anti-tamper device may be easily attached to the utility meter.

According to a possible embodiment, the guideway has a lead-in portion for leading the sealing element towards the predetermined breaking zone. The lead-in portion may comprise a guide surface which can be inclined in such a way that at least a part of the guideway is funnel-shaped for leading the sealing element towards the predetermined breaking zone upon mechanical manipulation of the sealing element. Thereby, lead-in portion may act as a mechanical stress concentrator helping to concentrate mechanical stresses at the predetermined breaking zone such that a tamper attempt is reliably indicated by breaking or at least damaging of the anti-tamper device.

According to a possible embodiment, an apex formed along the guideway at least in part forms the predetermined breaking zone. The apex may be created at a vertex formed by guide surfaces of the guideway. The apex may point into a direction along the longitudinal axis of the mounting portion. This further helps to guide the sealing element towards the predetermined breaking zone upon mechanical manipulation of the sealing element.

According to a possible embodiment, the predetermined breaking zone at least in part is arranged in a wall portion of the anti-tamper device. The wall portion may break or crack when the sealing element damages the predetermined breaking zone upon mechanical manipulation of the sealing element. At the break or crack, an opening may be created on the wall portion which allows the sealing element to slip through the opening and then be detached from the anti-tamper device in such a manner that it may not be reattached thereto. This helps to reliably indicate a tamper attempt.

According to a possible embodiment, at least a part of the guideway is formed in an actuating portion of the anti-tamper device. As commonly, the actuating portion would be accessible and visible from the outside of the utility meter, any tamper attempt affecting the predetermined breaking zone at the guideway maybe easily detected. Furthermore, the actuating portion can be visibly and tangibly provided with the sealing element extending along the guideway. This helps to prevent any manipulation of the anti-tamper device, in particular the actuating portion thereof.

According to a possible embodiment, at least a part of the guideway is associated to an actuation face of the anti-tamper device. As also the actuation face would commonly be accessible and visible from the outside of the utility meter, any tamper attempt affecting the predetermined breaking zone at the guideway may be easily detected. The actuation face itself may be provided with the predetermined breaking zone. This further helps to clearly indicate any tampering attempt.

According to a possible embodiment, at least a part of the guideway is formed as a through-hole extending through the anti-tamper device. This facilitates captively attaching the sealing element to the anti-tamper device. The through-hole may be arranged such that it lies in the vicinity of the wall portion of the anti-tamper device. The wall portion may constitute at least a part of a sealing of the through-hole. This helps to arrange the sealing element in an advantageous manner with respect to the predefined breaking zone.

According to a possible embodiment of the enclosure, the socket configured for receiving an anti-tamper device according to the present invention may have a shape complementing a shape of the anti-tamper device. In the socket, any counter mounting members, counter latching elements and/or other components may be arranged in a manner such that they are inaccessible from outside of the utility meter.

According to a possible embodiment of the utility meter, it comprises at least one switch or actuator configured to be actuated by the anti-tamper device and/or at least one locking arrangement configured to be locked by the anti-tamper device. Therefore, the anti-tamper device may comprise an actuating member and/or actuating element. When in the securing position, the actuation member and/or actuating element may be prevented from actuating the switch or actuator. Thereby, the anti-tamper device may advantageously provide a sealing, actuating and/or locking functionality for the utility meter.

BRIEF DESCRIPTION OF THE DRAWINGS

The invention will be described hereinafter in more detail and in an exemplary manner using advantageous embodiments and with reference to the drawings. The described embodiments are only possible configurations in which, however, the individual features as described above can be provided independently of one another or can be omitted. In the drawings.

WAYS OF EXECUTING THE INVENTION

Figure 1:
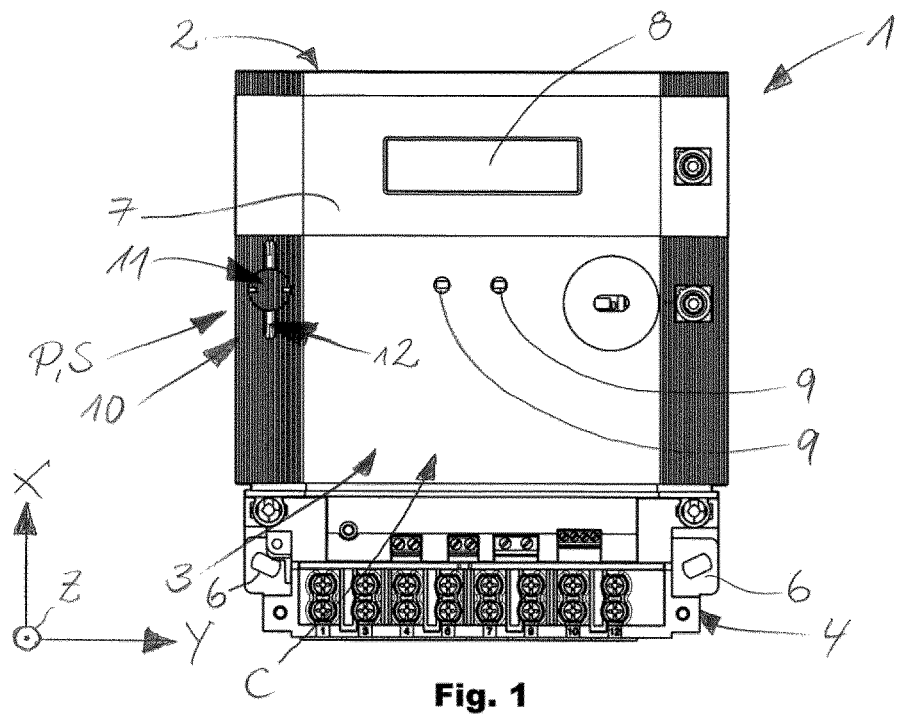
FIG. 1 shows schematic front view of an embodiment of a utility meter according to the present invention.

FIG. 1 shows a schematic front view of an exemplary embodiment of a utility meter 1 according to the present invention. The utility meter 1 extends along a longitudinal direction X, a transverse direction Y, and a height direction Z, together constituting a Cartesian coordinate system. The utility meter 1 has an enclosure 2 providing an insulating housing for accommodating electronic components and conductor connection devices of the utility meter 1. The enclosure 2 comprises a cover 3 and a base 4.

Figure 3:
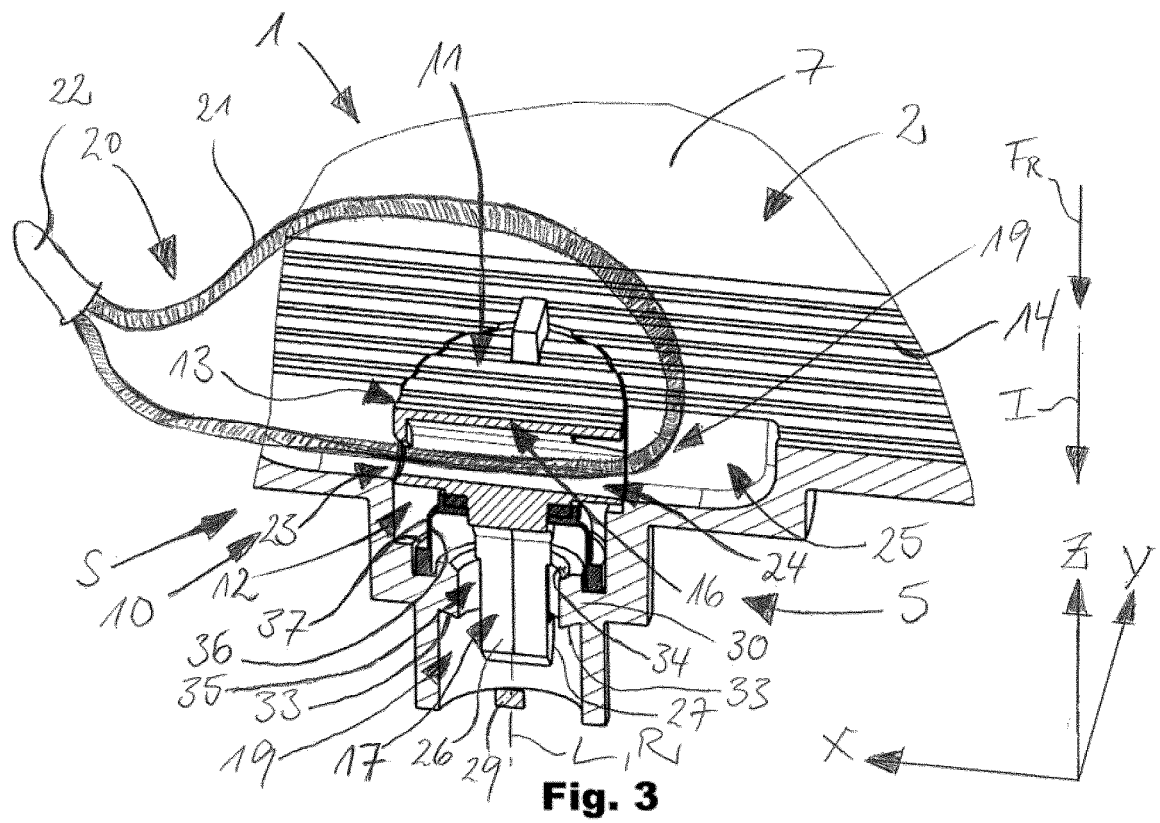
FIG. 3 shows schematic cross-sectional view of an embodiment of an anti-tamper device according to the present invention in a securing position at the cover of the enclosure shown in FIG. 2.
Figure 4:
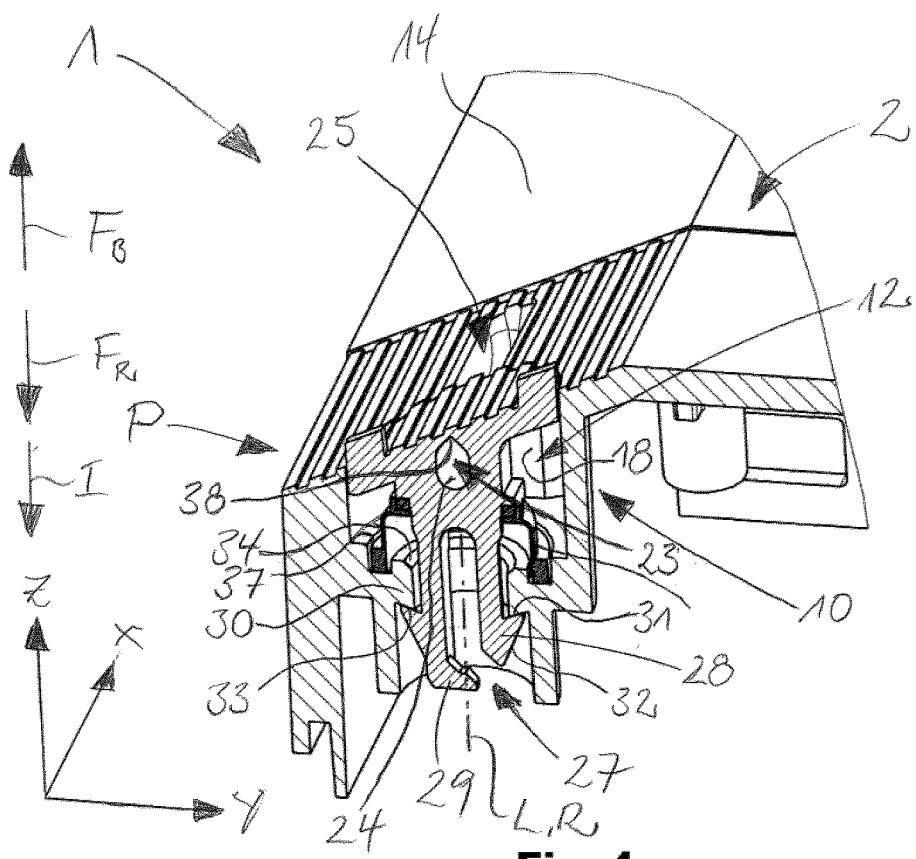
FIG. 4 shows another schematic cross-sectional view of an embodiment of an anti-tamper device according to the present invention in a securing position at the cover of the enclosure shown in FIGS. 2 and 3.

The cover 3 is formed as a lid which is removable from the base 4 to grant access to an interior space 5 of the electricity meter 1 (see FIGS. 3 and 4). The base 4 is configured to be mounted to a supporting structure (not shown) and therefore provided with respective fixation means 6. Furthermore, in a region of a front panel 7 of the enclosure 2, a display 8 and control elements 9, such as light emitting diodes (LEDs), are provided for monitoring and controlling, respectively, functionality and operation of the electricity meter 1.

An anti-tamper arrangement 10 comprising an anti-tamper device 11 is provided for sealing the utility meter 1 in a sealed state S. In the sealed state S, the anti-tamper device 11 is received in a securing position P in a socket 12 of the enclosure 2. In the securing position P, the anti-tamper device 11 does not allow for actuation of an actuator, such as an electric switch or alike (not shown), of the electricity meter 1, in particular in a closed position C of the cover 3 as illustrated in FIG. 1.

Figure 2:
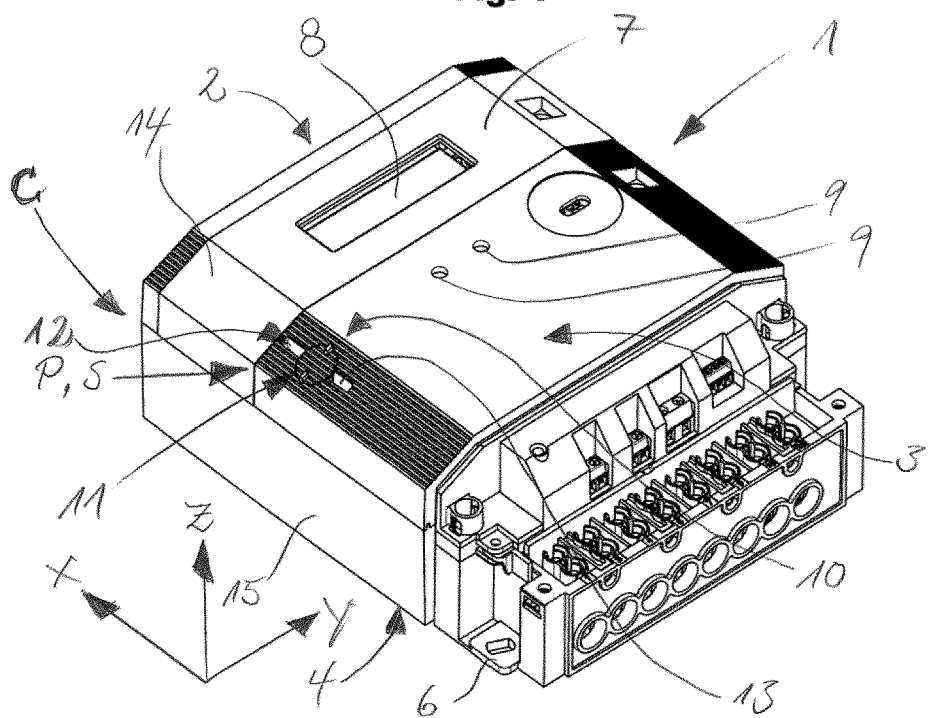
FIG. 2 shows schematic perspective view of the utility meter shown in FIG. 1.

FIG. 2 shows a schematic perspective view of the utility meter 1 shown in FIG. 1. Here it becomes apparent that the anti-tamper arrangement 10 further comprises an opening 13 which is arranged at a slanted edge region 14 of the enclosure 2. The edge region 14 is formed between the front panel 7 and a side face 15 of the cover 3.

FIG. 3 shows schematic cross-sectional view of an embodiment of the anti-tamper device 11 in the securing position P at the cover 3 of the enclosure 2. The anti-tamper device 11 comprises an actuation portion 16 and a mounting portion 17. The actuation portion 16 is received in a sealing section 18 of the socket 12 (see FIG. 4). The mounting portion 17 is received in a locking section 19 of the socket 12. The sealing section 18 is arranged above the locking section 19. The anti-tamper arrangement 10 further comprises a sealing element 20. The sealing element 20 comprises a wire 21 and a seal 22. The seal 22 fixes two free ends of the wire 21 to each other, such that the wire forms a loop which may only be opened by cutting the wire 21 and/or breaking the seal 22.

The actuation portion 16 is secured by means of the sealing element 20. Therefore, a section of the wire 21 extends along a guideway 23 provided by the enclosure 2 and an anti-tamper device 11, in that the anti-tamper device is provided with a through-hole 24, and the enclosure 2, in particular the cover 3, is provided with a passage 25 adjoining each other. The through-hole 24 extends from one side of the actuation portion 16 to another side of the actuation portion 16 of the anti-tamper device 11. The passage 25 is provided at both sides of the actuation portion 16 and opens towards the front panel 7, in particular the edge region 14, so that the wire 21 can enter the front panel 7 to prevent rotational movement of the anti-tamper device 11 around a longitudinal axis L of the mounting portion 17 constituting a rotational axis R of the anti-tamper device 11.

The mounting portion 17 retains the anti-tamper device 11 and the sealing element 20 within the socket 12. Therefore, the mounting portion 17 is provided with a shaft 26 and mounting means 27. The shaft 26 extends away from the actuation portion 16. The mounting means 27 are arranged in an end region of the shaft 26 located in the locking section 19 of the socket 12. The mounting means 27 comprise at least one latching element 28 (see FIG. 4) and at least one actuating element 29. The latching element 28 is configured to engage with at least one counter latching element 30 formed in the socket 12. The actuating element 29 is configured to engage the base 4, in particular a switch or actuator (not shown) provided at the base 4.

The latching element 28 is formed as a latching nose comprising a holding surface 31 and a bevel 32 (see FIG. 4). The counter latching element 30 is formed as a step providing a retaining surface 33. When the anti-tamper device 11 is inserted into the socket 12 in an insertion direction I extending essentially in parallel to the longitudinal axis L, the bevel 32 impinges on a lead-in chamfer 34 formed at the counter latching element 30 and at least partially facing in a direction opposite to the insertion direction I. Upon further insertion of the anti-tamper device 11 into the socket 12, the latching element 28 is deflected so that the mounting means 27 may pass through an annular narrowing 35 formed in the socket 12 in the region of the counter latching element 30. After passing the annular narrowing 35, the latching element 28 snaps back from its deflected position behind the counter latching element 30, such that the holding surface 31 abuts the retaining surface 33. Thereby, the mounting means 27, in particular the latching element 28, overlaps with the locking section 19, in particular the counter latching element 30, in a direction opposite to the insertion direction I. The anti-tamper device 11 is retained in the socket 12 with a retention force $F_R$ acting in the insertion direction I and preventing the anti-tamper device 11 from being pulled out from the socket 12 in a direction opposite to the insertion direction I.

Furthermore, a gasket 36 is arranged between the anti-tamper device 11 and the socket 12, such that the gasket 36 abuts the actuation portion 16 from and an inner circumference of the socket 12 while firmly encompassing the mounting portion 17, in particular the shaft 26 thereof, in order to seal up the interior space 5 of the enclosure 2 with respect to the opening 13 of the socket 12, and to inhibit unwanted rotational movements of the anti-tamper device 11 around the rotational axis R of the anti-tamper device 11. By sealing up the interior space 5 of the enclosure 2, the gasket 36 provides ingress protection of dust, water, etc. to the utility meter 1.

FIG. 4 shows another schematic cross-sectional view the anti-tamper device 11 in the securing position P at the cover 3 of the enclosure 2 shown in FIGS. 2 and 3. Here it becomes apparent that the guideway 23 is provided with a predetermined breaking zone 38 in the region of the through-hole 24. If the sealing element 20 exerts a predefined breaking force $F_B$ onto the predefined breaking zone 38, the anti-tamper device 11 will break or at least get damaged at the predefined breaking zone 38. The predefined breaking force $F_B$ is applied essentially in a direction opposite to the insertion direction I and is smaller than the retention force $F_B$, such that the anti-tamper device 11 will break up at the actuation portion 16, thereby releasing the sealing element 20 from being captively held in the through-hole 24, while being retained in the socket 12.

Furthermore, it becomes evident from FIG. 4, that the actuating element 29 protrudes from the mounting portion 17 in a direction transverse to the longitudinal axis L and the rotational axis R. The rotational axis R extends through the actuating element 29. Thereby, upon turning the anti-tamper device 11 around the rotational axis R when the anti-tamper device 11 is fully inserted into the socket 12 in the insertion direction I, the actuating element 29 can be moved into a rotational position where it opposes as switch or actuator (not shown) provided at the base 4, such that the actuating element 29 overlaps with the switch or actuator in a direction opposite to the insertion direction I, and thus can actuate the switch or actuator when being moved in the insertion direction towards the switch or actuator.

Figure 5:
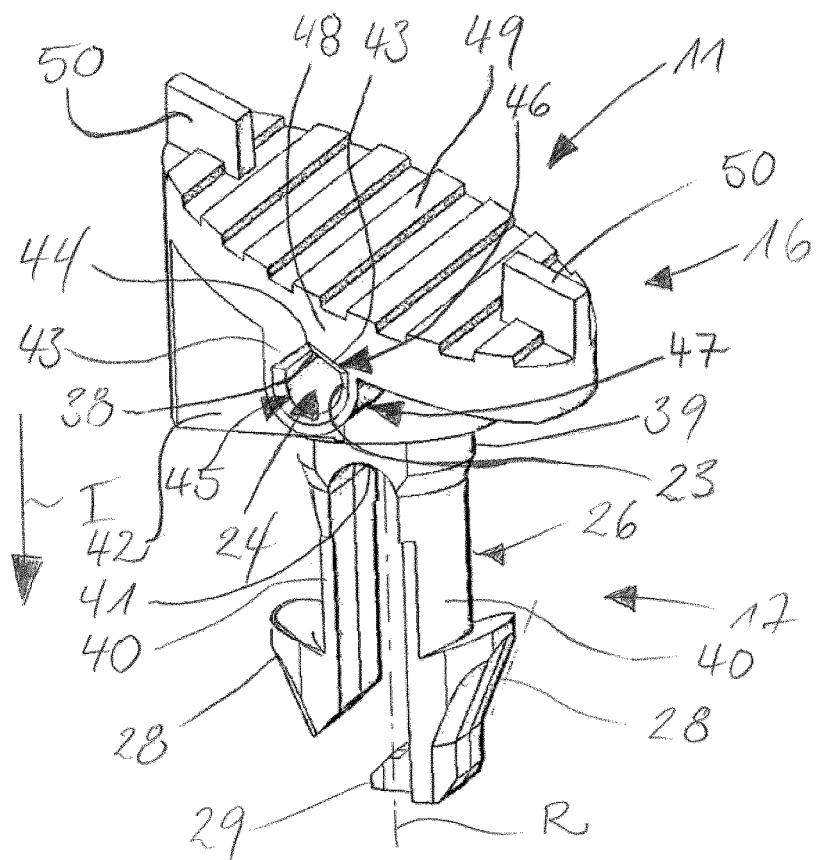
FIG. 5 shows a schematic perspective view of an embodiment of an anti-tamper device according to the present invention.

FIG. 5 shows a schematic perspective view of the anti-tamper device 11. Here it becomes apparent, that the mounting portion 17, in particular the shaft 26 thereof, comprises an upper cylindrical portion 39, from which two legs 40 extend downwardly in the insertion direction I. The legs 40 are connected to each other via a yoke 41 are joining the cylindrical portion 39. The latching elements 28 extend radially away from the legs 40, so that they are rotatable about the rotational axis R. The rotational axis R extends through the actuating element 29 which extends from one of the legs 40 radially towards the rotational axis R. Thereby, the actuating element 29 is arranged eccentrically with respect to the rotational axis R, thereby enabling to be moved into a juxtaposition with respect to the switch or actuator in a rotational movement.

The anti-tamper device 11 further comprises a blocking member 42 arranged at the actuation portion 16 in a way that the blocking member 42 extends radially away from the rotational axis R. The blocking member 42 is configured to blocking movements of the anti-tamper device 11 in the insertion direction I, in particular when the anti-tamper device 11 is in the securing position P, in order to prevent actuation of an actuator (not shown) of the utility meter 1. By actuating the actuator, which may be embodied as an electrical switch or alike, certain functionalities of the utility meter 1 may be enabled and/or disabled. Thereby, the blocking member 42 in conjunction with the actuator serves for defining a certain operational state of the utility meter 1. For example, when the anti-tamper device 11 is in the securing position P, the respective rotational position of the blocking member 42 inhibits an actuation of the actuator in such a way, that the utility meter 1 is in a locked and/or secured state, where certain functionalities of the utility meter 1 are locked and/or restricted, such that they may not be changed by unauthorised personnel.

The guideway 23 comprises guide surfaces 43 which meet it other at a vertex forming an apex 44 of the guideway 23. Thereby, a first aperture 45 towards the guideway 23 in a projection along the guideway 23 has an upper triangular cross-section and a lower cross-section having the shape of a semicircle. In the region of the upper triangular cross-section, the guideway 23 provides a lead-in area 46 for the sealing element 20. The lower cross section having the shape of the semicircle, the guideway 23 provides a supporting area 47 for the sealing element 20.

The apex 44 is situated in a wall portion 48 of the anti-tamper device 11. The wall portion 48 separates the through-hole 24 from an actuation face 49 of the anti-tamper device 11. In the region of the actuation face 49, the anti-tamper device 11 is provided with engagement elements 50 in the form of cuboid studs extending away from the actuation face 49 in a direction opposite to the insertion direction I. The engagement elements 50 enable to engage with an operating tool (not shown) in such a way that a torque can be applied to the anti-tamper device 11 for turning the anti-tamper device 11 around the rotational axis R.

Figure 6:
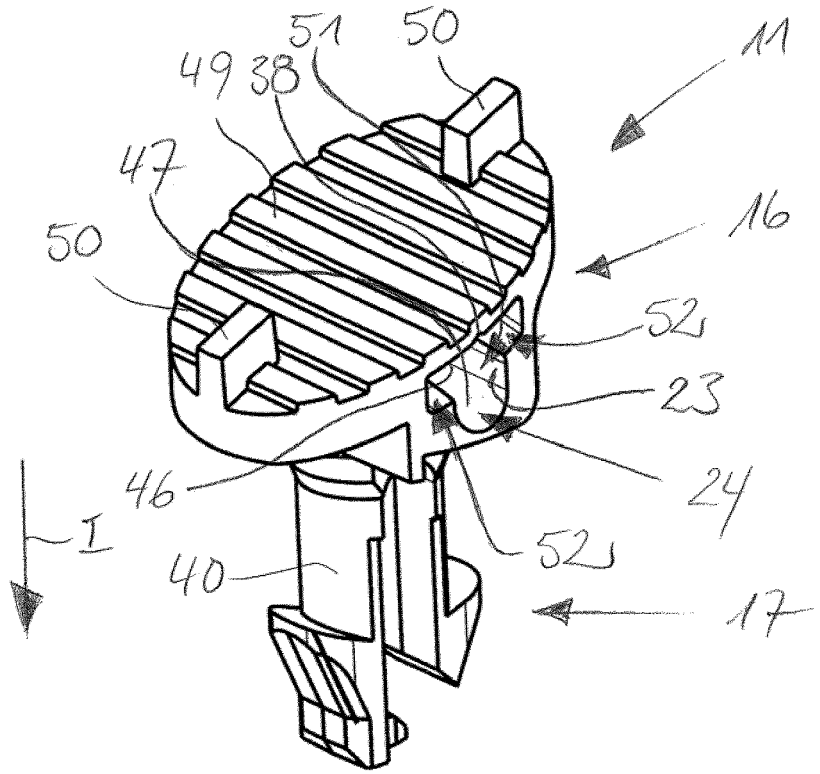
FIG. 6 shows another schematic perspective view of an embodiment of an anti-tamper device according to the present invention.

FIG. 6 shows another schematic perspective view of the anti-tamper device 11. Here it becomes apparent, that at the side of the actuation portion 16 opposing the first aperture 45, a second aperture 51 providing an opening for accessing the guideway 23 is provided. In the region of the second aperture 51, lateral recesses 52 are formed, such that the second aperture 51 in a projection along the guideway 23 is T-shaped with an upper flat cuboid portion and an again a semicircle-shaped lower portion providing the lead-in area 46 and the supporting area 47, respectively.

Figure 7:
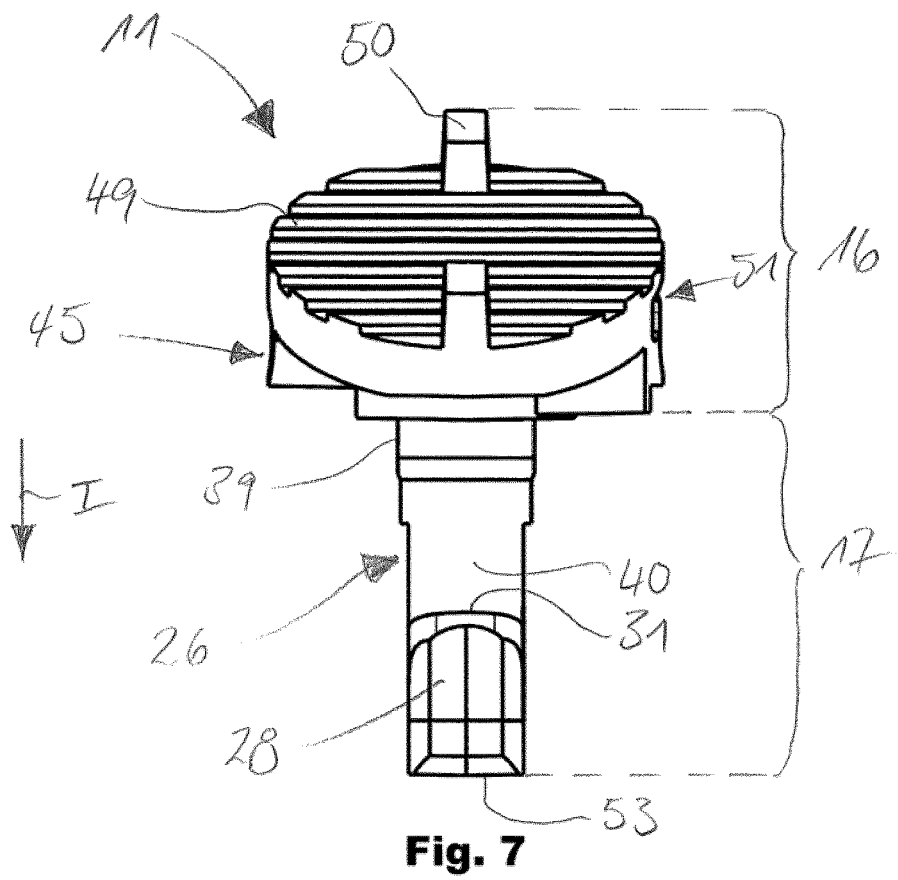
FIG. 7 shows a schematic front view of an embodiment of an anti-tamper device according to the present invention.

FIG. 7 shows a schematic front view of the anti-tamper device 11. Here it becomes apparent that the latching element 28, in particular the holding surface 31 thereof, is radiused and/or rounded. This helps to prevent the anti-tamper device 11 from getting jammed in the socket 12 upon rotation of the anti-tamper device 11 around the rotational axis R in the region where the latching element 28 abuts the counter latching element 30. Furthermore, the anti-tamper device 11 may serve as or maybe provided with an actuating member 53. The present embodiment, a lower end surface of the shaft 26, in particular of the actuating element 29, serves as the actuating member 53. When the anti-tamper device 11 is being pushed down in the insertion direction I, e.g. by manual actuation of the actuation face 49, the actuating member 53 may actuate an switch or actuator (not shown) of the utility meter 1 for unlocking and/or un-restricting certain functionalities thereof.

Figure 8:
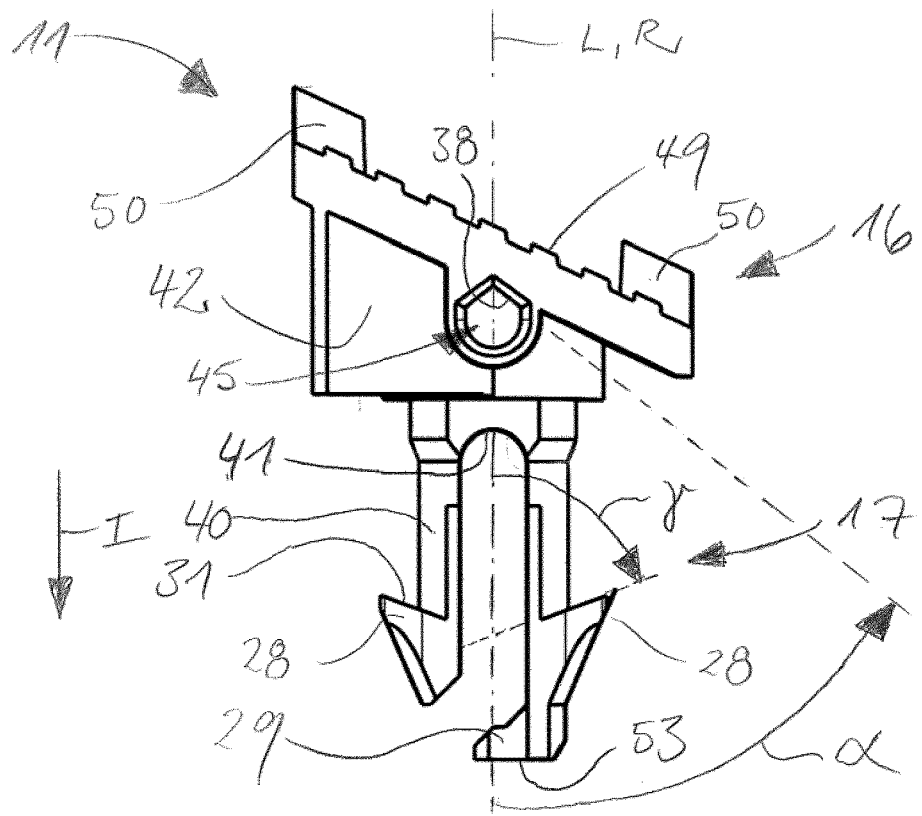
FIG. 8 shows a schematic left side view of an embodiment of an anti-tamper device according to the present invention.

FIG. 8 shows a schematic side view of the anti-tamper device 11. Here it becomes apparent, that the guide surface 38 in the region of the first aperture is 45 inclined under a first guiding angle $\alpha$ of approximately 50° with respect to the longitudinal axis L. The holding surface 31 is inclined under a holding angle $\gamma$ of approximately 70° with respect to the longitudinal axis L.

Figure 9:
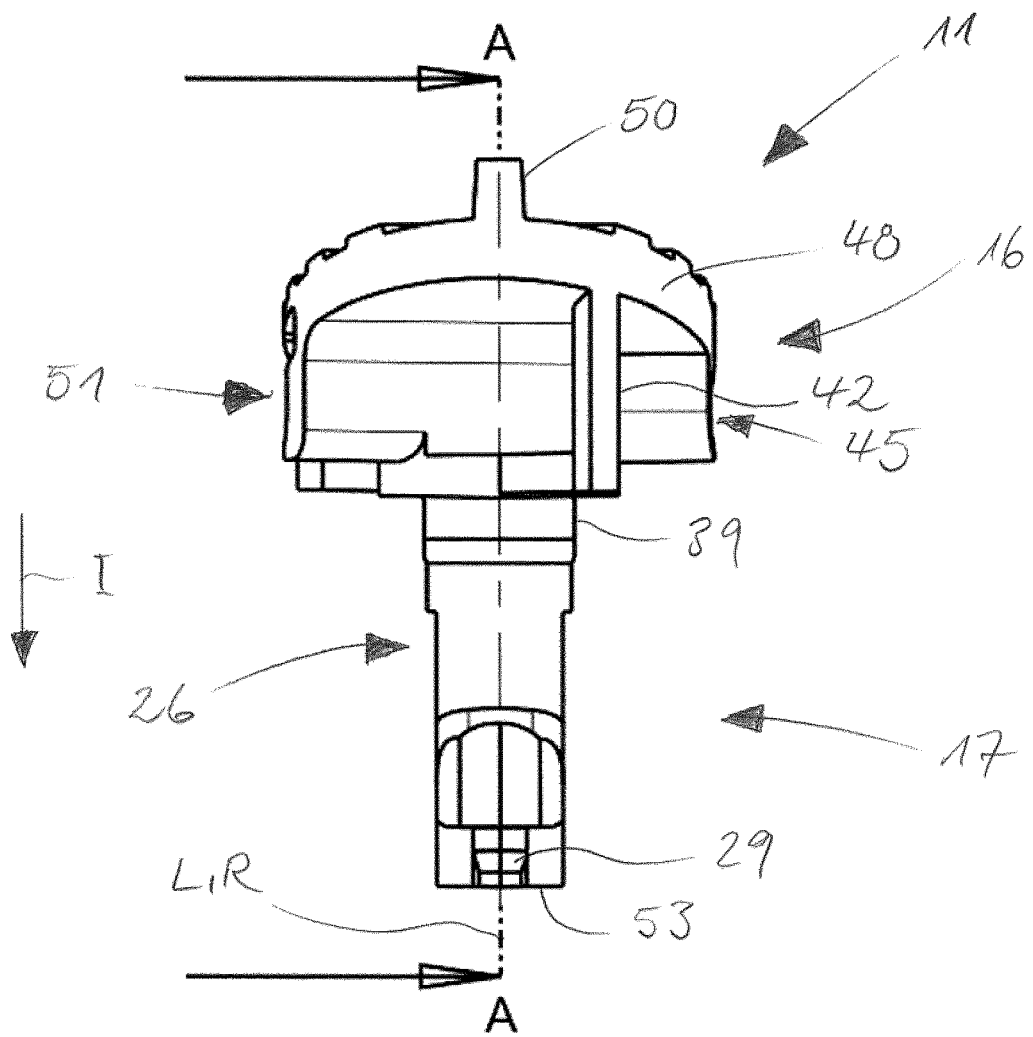
FIG. 9 shows a schematic rear view of an embodiment of an anti-tamper device according to the present invention.

FIG. 9 shows a schematic rear view of the anti-tamper device 11. Here it becomes apparent, that the blocking member 42 is formed as a strut or brace extending downwardly from the wall portion 48 while being connected to an outside surface of the guideway 23 (see FIG. 5). The locking member 42 is offset from the longitudinal axis L and rotational axis R underlined with the shaft 26, in particular the cylindrical portion 39 thereof.

Figure 10:
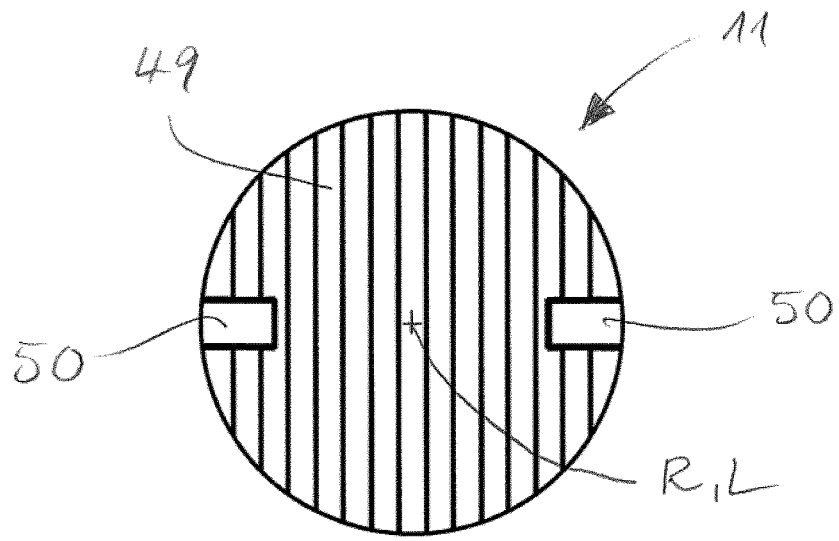
FIG. 10 shows a schematic top view of an embodiment of an anti-tamper device according to the present invention.

FIG. 10 shows a schematic top view of the anti-tamper device 11. Here it becomes apparent, that the actuation face 49 is essentially of a circular shape. The engagement elements 50 are arranged in an adverse region of the actuation face 49. This arrangement of the engagement elements 50 facilitates to apply a torque to the anti-tamper device 11 acting around the rotational axis R in order to turn the anti-tamper device 11 into the securing position P or to turn the anti-tamper device 11 out of the securing position P.

Figure 11:
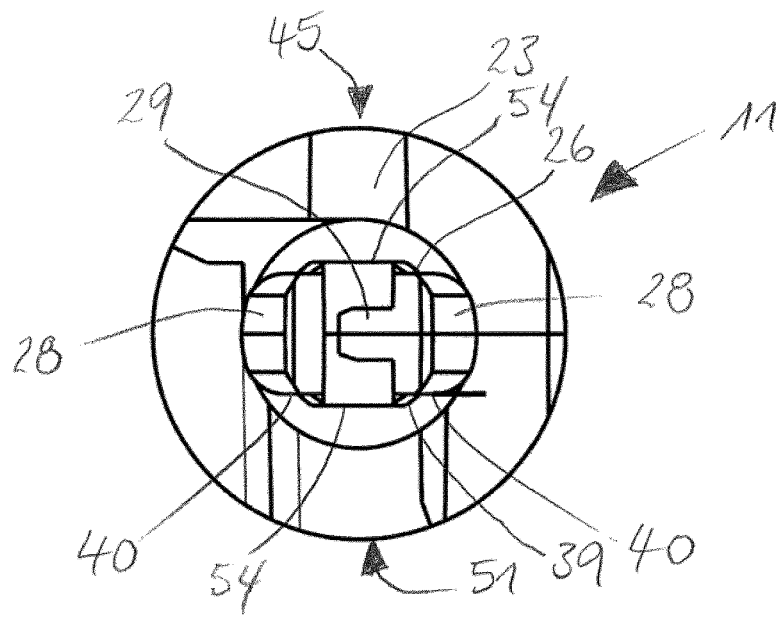
FIG. 11 shows a schematic bottom view of an embodiment of an anti-tamper device according to the present invention.

FIG. 11 shows a schematic bottom view of the anti-tamper device 11. Here it becomes apparent, that the guideway 23 widens in a direction perpendicular to the insertion direction I from the first aperture 45 to the second aperture 51. Furthermore, a width of the actuating element 29 measured in a direction perpendicular to the longitudinal axis L is smaller than a width of the shaft 26, in particular the legs 40. The cylindrical portion 39 is provided with flat sections 54 which enable a positive-fit engagement between the anti-tamper device 11 and an upper portion of the gasket 36. Due to friction between the gasket 36 and the inner circumference 37 of the socket 12, the positive fit between the anti-tamper device 11 and the upper portion of the gasket 36 may help to inhibit unwanted rotational movements of the anti-tamper device 11 around the rotational axis R.

Figure 12:
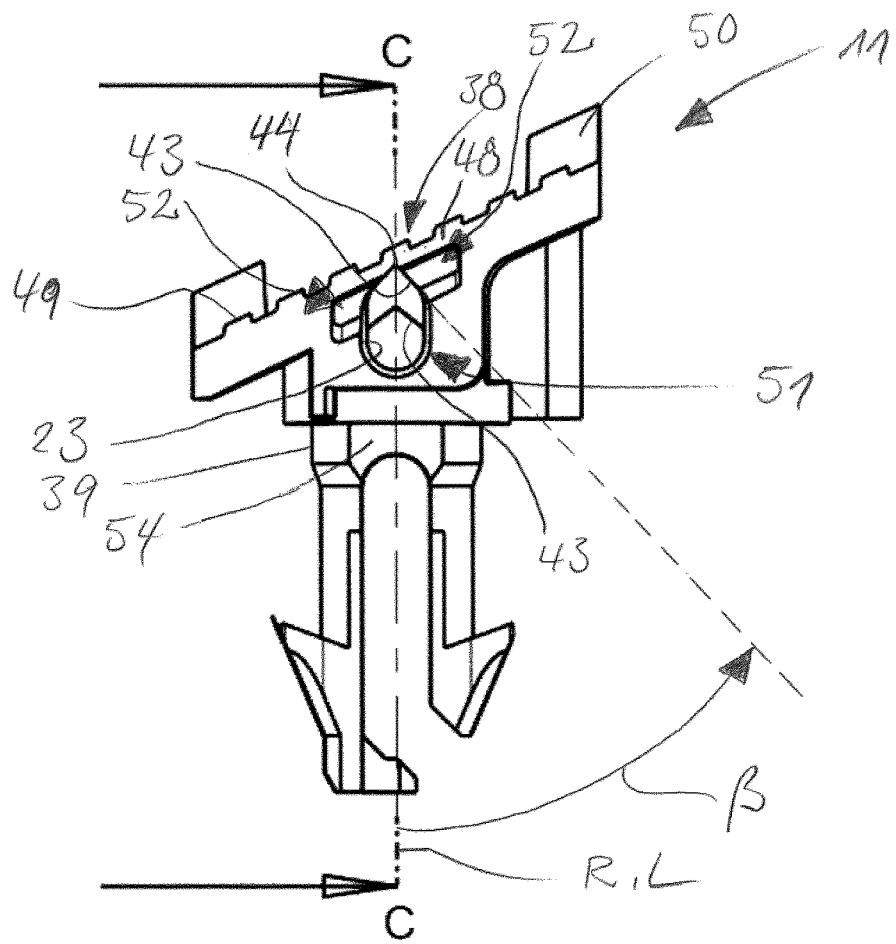
FIG. 12 shows another schematic right side view of an embodiment of an anti-tamper device according to the present invention.

FIG. 12 shows another schematic side view of the anti-tamper device 11. Here it becomes apparent, that the guide surfaces 43 in the region of the second aperture 51 are inclined with respect to the longitudinal axis L under a second guiding angle $\beta$ of approximately 40°. Hence, the second guiding angle $\beta$ in the region of the second aperture 51 is smaller than the first guiding angle $\alpha$ in the region of the first aperture 45. At the same time, a thickness of the wall portion 48 in the region of the second aperture 51 is smaller than a thickness of the wall portion 48 in the region of the first aperture 45. Thereby, in the region of the second aperture 51, the predefined breaking zone 38 is weaker than the region of the first aperture 45. However, even with the reduced thickness of the wall portion 48 in the region of the second aperture 45, the apex 44 is positioned in the wall portion 48, such that at least a small notch is formed for concentrating mechanical stresses at the predefined breaking zone 38, and thus facilitating an initial fracture or crack in the predefined breaking zone 38.

Figure 13:
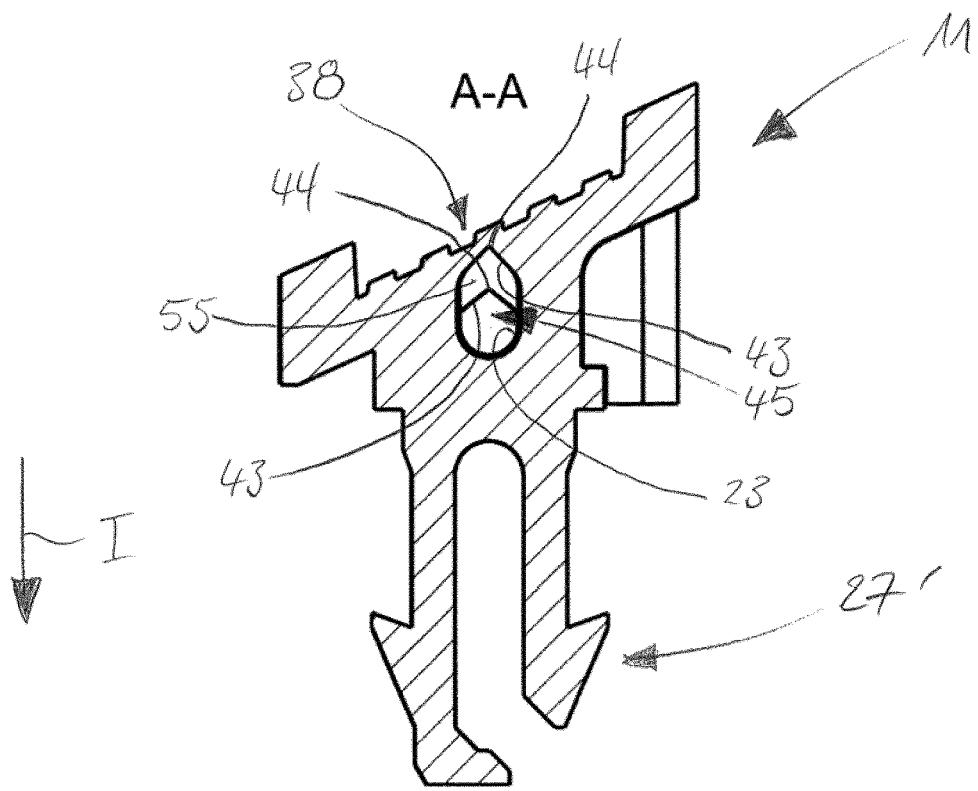
FIG. 13 shows a schematic cross-sectional view of an embodiment of an anti-tamper device according to the present invention along a cross-sectional line A-A illustrated in FIG. 9.

FIG. 13 shows a schematic cross-sectional view of the anti-tamper device 11 along the cross-sectional line A-A illustrated in FIG. 9, i.e. along the longitudinal axis L. Here it becomes apparent, that in the region of the first aperture 45, the guiding surfaces 43 are formed in a lower edge region of a lateral wall 55 defining the first aperture 45.

Figure 14:
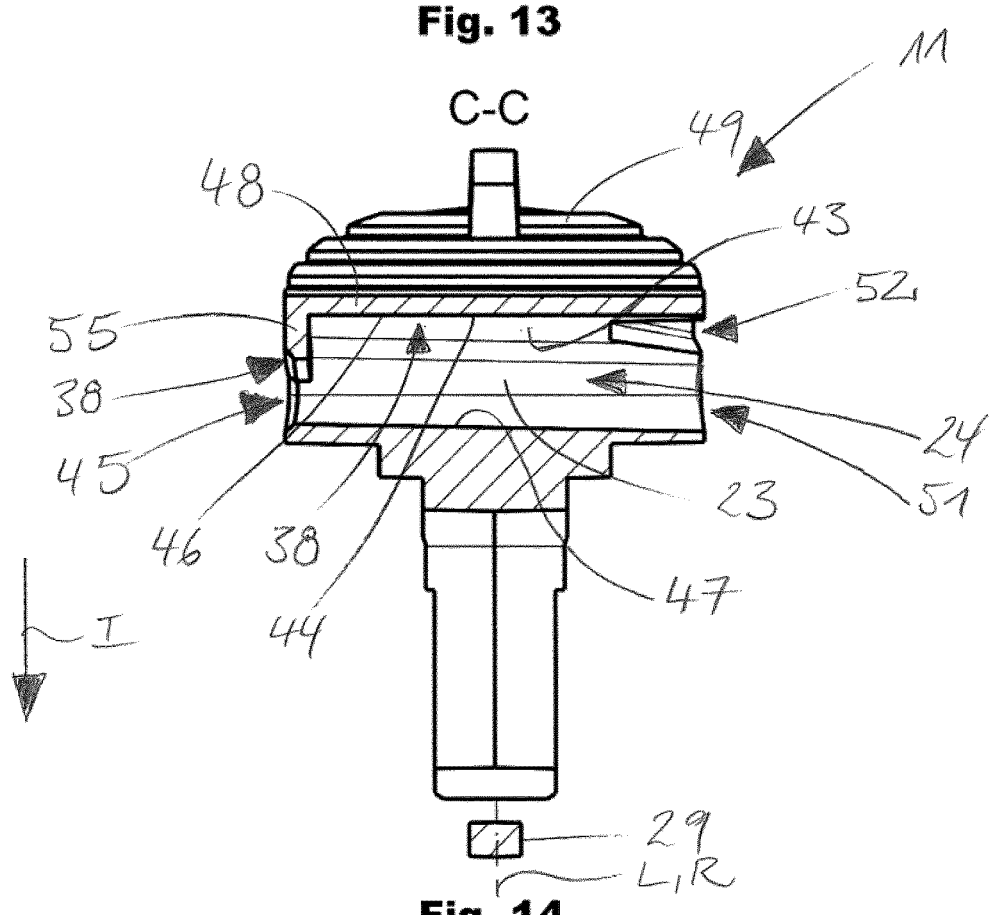
FIG. 14 shows a schematic cross-sectional view of an embodiment of an anti-tamper device according to the present invention along a cross-sectional line C-C illustrated in FIG. 12.

FIG. 14 shows a schematic cross-sectional view of the anti-tamper device 11 according to the cross-sectional line C-C illustrated in FIG. 12, i.e. along the longitudinal axis L. Here it becomes apparent, that the apex 44, and thus the predefined breaking zone 38 in the region of the wall portion 48 extends along the entire length of the guideway 23 as it is provided in the through-hole 24 extending from the first aperture 45 to the second aperture 51, i.e. from one lateral side of the anti-tamper device 11 to the opposing other lateral side of the anti-tamper device 11. In the region of the first aperture 45, the predetermined breaking zone 38 is arranged at the apex 44 provided at the lateral wall 55.

If the sealing element 21 as it is extending along the guideway 23 is pulled in a direction opposite to the insertion direction I, respective breaking forces $F_B$ primarily occur at the lateral wall 55 since there, the guiding surfaces 43 are arranged in the insertion direction I before the guiding surfaces 43 as they extend along the upper triangular cross-section of the through-hole 24. This helps in provoking first initial fractures or cracks to occur in the region of the wall portion 48 at the second aperture 51. Upon further pulling of the sealing element 21 in a direction opposite to the insertion direction I, these first initial fractures or cracks will continue along the predefined breaking zone 38 from the second aperture 51 along the guideway 23 towards the lateral wall 55. Consequently, in the event of a tamper attempt involving the application of breaking forces $F_B$ to the anti-tamper device 11 via the sealing element 20, first the wall portion 48 and then the lateral wall 55 will be ripped apart, such that an opening (not shown) is created through which the sealing element 20 slips from the guideway 23 out of the through-hole 24.

Figure 15:
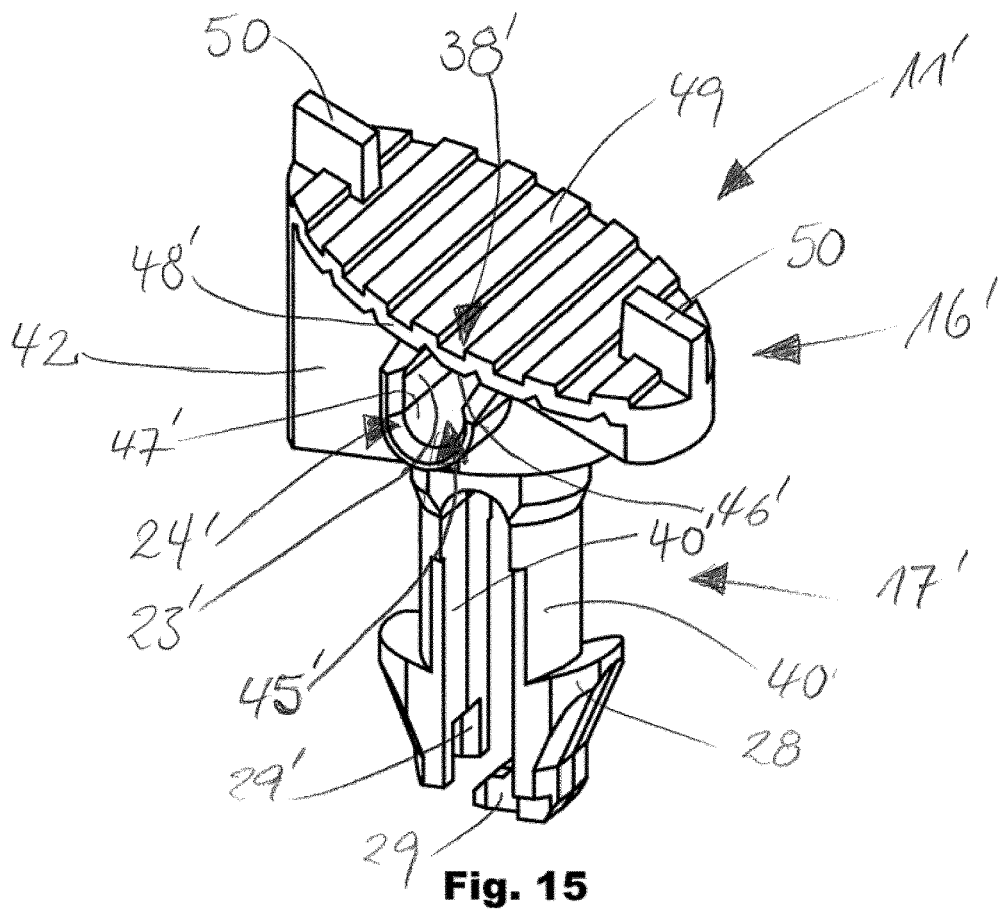
FIG. 15 shows a schematic perspective view of a further embodiment of an anti-tamper device according to the present invention.
Figure 16:
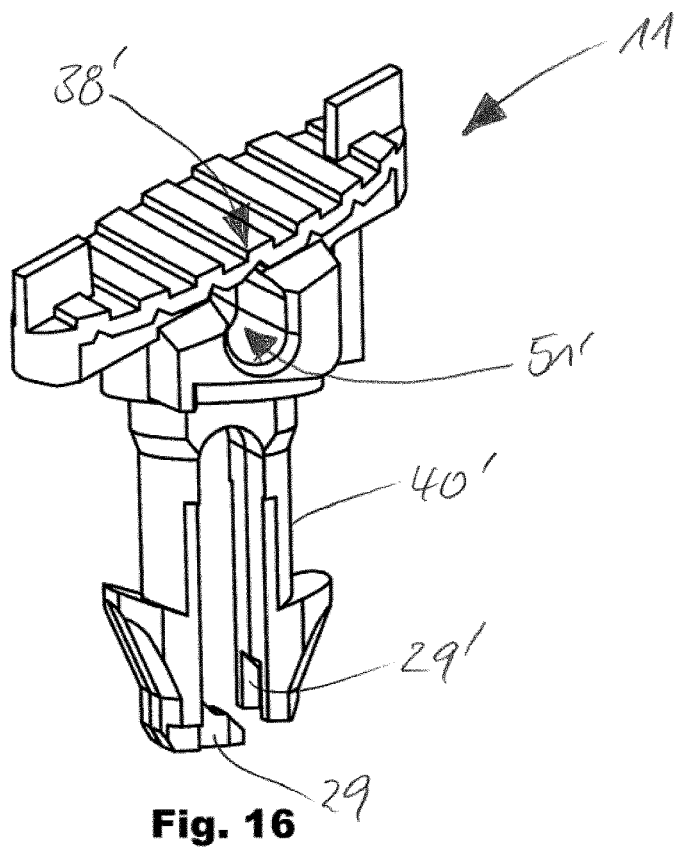
FIG. 16 shows another schematic perspective view of a further embodiment of an anti-tamper device according to the present invention.

FIGS. 15 and 16 show a schematic perspective views of a further embodiment of an anti-tamper device 11' according to the present invention. For the sake of brevity, merely differences between the embodiment of the anti-tamper device 11 as described above with reference to FIGS. 1 to 14, and the further embodiment of the anti-tamper device 11' will be described in the following with reference to FIGS. 15 to 20. Parts, portions, sections, components, and elements of the further embodiment of the anti-tamper device 11' having a same or at least similar functionality to corresponding parts, portions, sections, components, and elements of the anti-tamper device 11 will be provided with the same reference signs denoted with an apostrophe for indicating that they belong to the further embodiment of the anti-tamper device 11'.

The anti-tamper device 11' comprises an actuation portion 16' and a mounting portion 17'. The actuation portion 16' comprises a guideway 23' with a first aperture 45' and a second aperture 51' (see FIG. 16), as well as a predetermined breaking zone 38' in the region of a lead-in area 46', and a supporting area 47. The mounting portion 17' comprises two legs 40, 40' which are provided with latching elements 28. The leg 40 is provided with the actuating element 29. The leg 40' is provided with a recess 29' in the form of a notch or cavity having a cuboid shape complementary to that of the actuating element 29.

Figure 17:
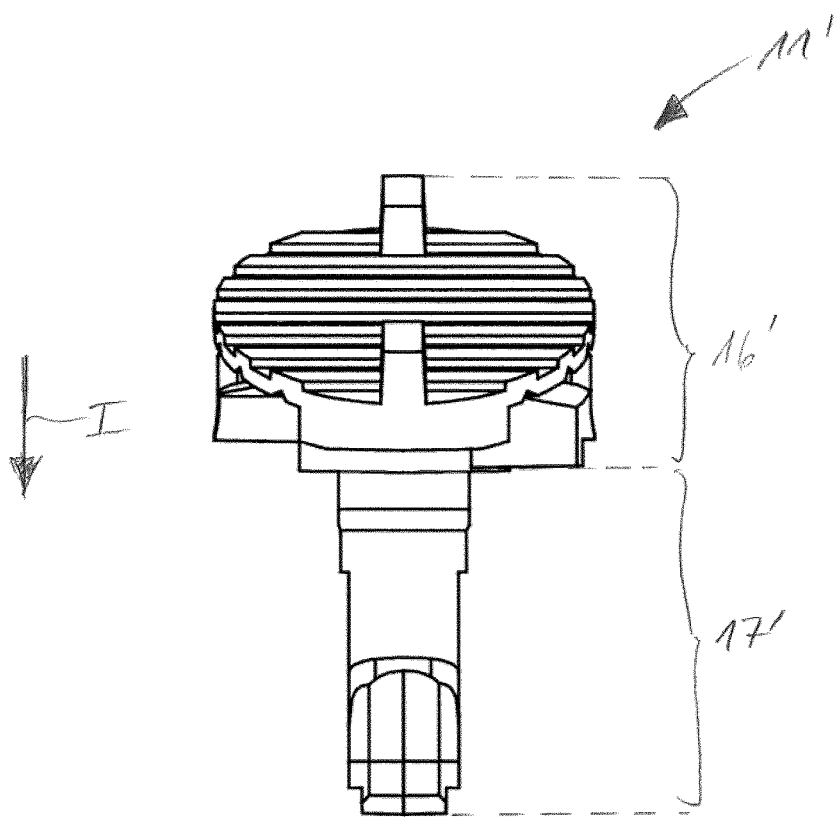
FIG. 17 shows a schematic front view of a further embodiment of an anti-tamper device according to the present invention.
Figure 18:
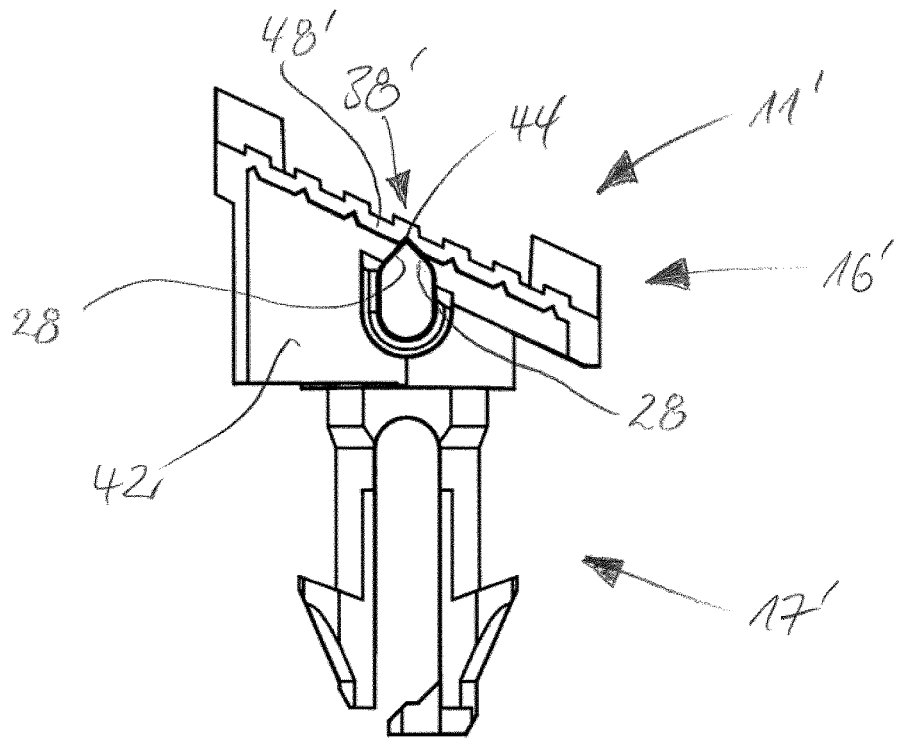
FIG. 18 shows a schematic left side view of a further embodiment of an anti-tamper device according to the present invention.

FIGS. 17 and 18 show a schematic front view and a schematic side view, respectively, of the further embodiment of an anti-tamper device 11. In FIG. 18 it becomes apparent that the predetermined breaking zone 38' of a further embodiment of the anti-tamper device 11' comprises guide surfaces 28 and a respective apex 44 as provided at the anti-tamper device 11. However, in the further embodiment of the anti-tamper device 11', the lateral wall 55 is left out. Hence, the predefined breaking zone 38' simply extends from the first aperture 45 to the second aperture 41 which have an identical cross-section.

Figure 19:
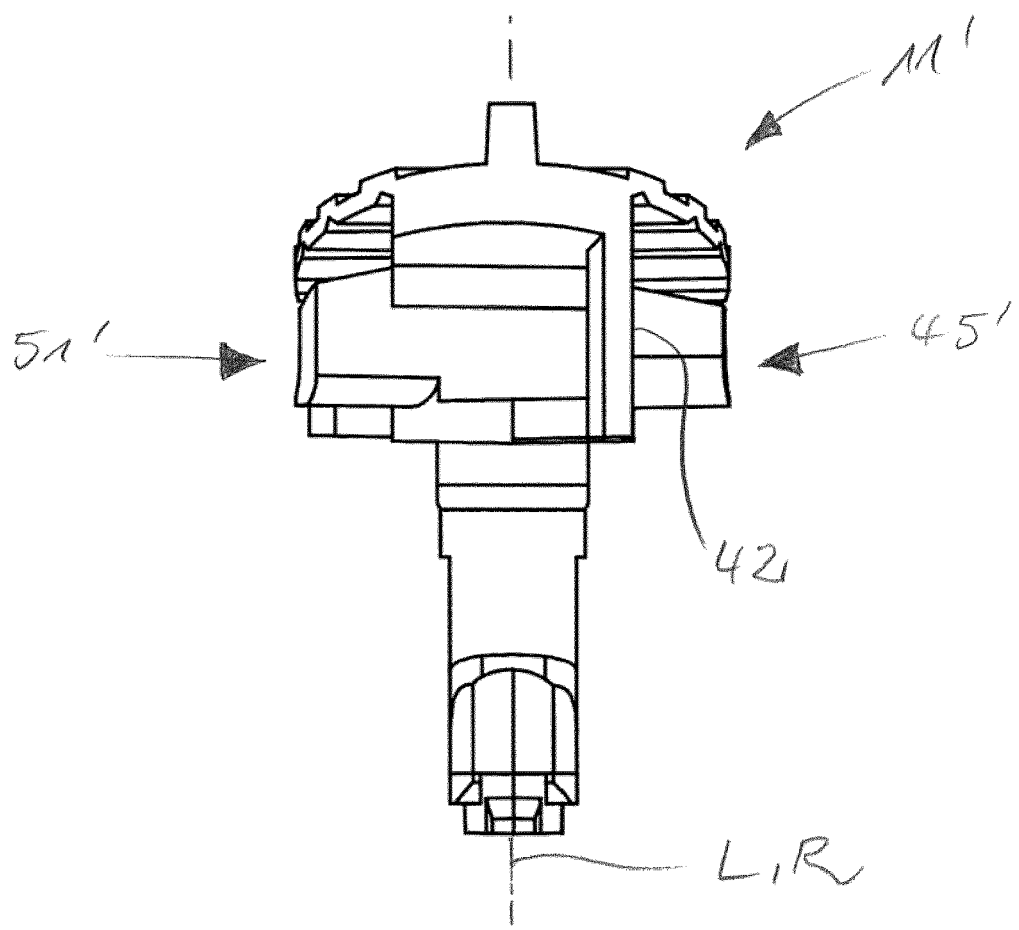
FIG. 19 shows a schematic rear view of a further embodiment of an anti-tamper device according to the present invention.
Figure 20:
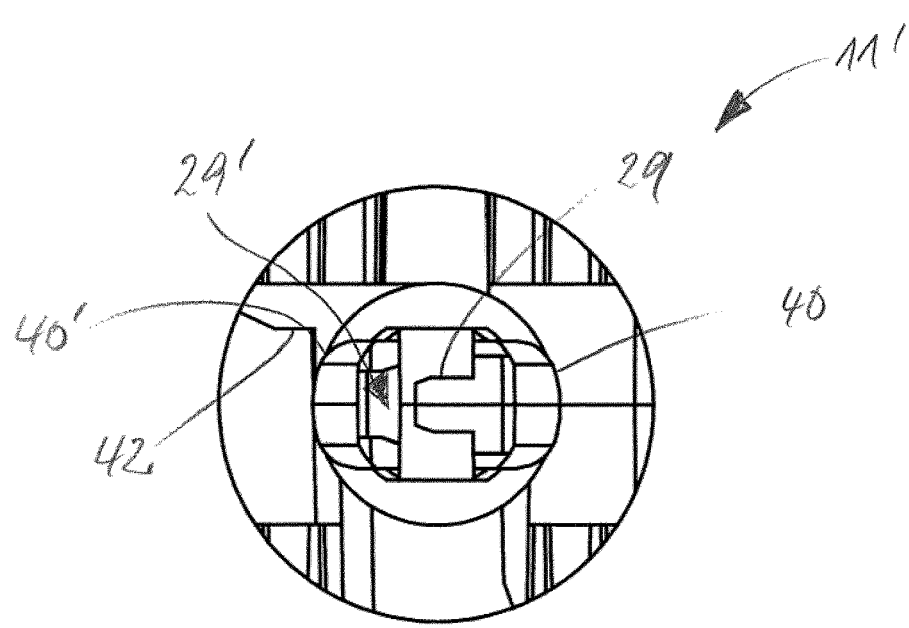
FIG. 20 shows a schematic bottom view of a further embodiment of an anti-tamper device according to the present invention.

FIGS. 19 and 20 shows a schematic rear view and a schematic bottom view, respectively, of the further embodiment of an anti-tamper device 11. In FIG. 20 becomes apparent that the recess 29' opposes the actuating element 29 with respect to the longitudinal axis L as well of the axis of rotation R. By providing the actuating element 29 and the recess 29' at the legs 40, 40', such that they oppose each other with respect to the longitudinal axis L, the actuating element 29 can protrude into the recess 29 upon deflection of the latching elements 28. This helps to prevent that the actuating element 29 limits the deflection of the legs 40, 40' towards each other by abutting the leg 40' in the course of deflecting the legs 40, 40' towards each other at the latching elements 28 when moving the anti-tamper device 11, 11' in the insertion direction I into the socket 12 and thereby urging the latching elements 28 past the counter latching element 30.

Deviations from the above-described embodiments are possible without departing from the scope of the present invention.

The utility meter 1 may comprise enclosures 2, serving as insulating housing, with covers 3, and bases 4 in any number and form desired for protecting operators as well as parts of the utility meter 1 in an interior space 5 thereof. The utility meter 1, in particular the cover 3, can be provided with front panels 7, displays 8, control elements 9, sockets 12, openings 13, edge regions 14, side faces 15, sealing sections, locking sections 19, passages 25, counter latching elements 30, retaining surfaces 33, lead-in chamfers 34, annular narrowings 35 and/or inner circumferences 37 in any number and form required. The base 4 can be provided with fixation means 6 as well as switches or actuators (not shown) in any number and form required.

The anti-tamper arrangement 10 may comprise anti-tamper devices 11, 11', sealing elements 20, sockets 12, gaskets 36 and/or respective interacting parts of the base 4 in any number and form required for providing sealing, latching, locking, and/or actuating functionalities. The sealing element 20 may comprise wires 21 and/or seals 22 in any number and form required.

The anti-tamper device 11, 11' may comprise actuation portions 16, 16', mounting portion 17, 17', guideways 23, 23', through-holes 24, 24', shafts 26, latching elements 28, actuating elements 29, recesses 29', holding surfaces 31, bevels 33, predetermined breaking zones 38, 38' cylindrical portions 39, legs 40, 40' yokes 41, blocking members 42, guide surfaces 43, apexes 44, first apertures 45, 45', lead-in areas 46, 46', supporting areas 47, 47', wall portions 48, 48', actuation faces 49, engagement elements 50, second apertures 51, 51' lateral recesses 52, actuating members 53, flat sections 54 and/or lateral walls 55 in any number and form required.

| | Reference Signs |
|---|---|
| 1 | utility meter |
| 2 | enclosure |
| 3 | cover |
| 4 | base |
| 5 | interior space |
| 6 | fixation means |
| 7 | front panel |
| 8 | display |
| 9 | control elements |
| 10 | anti-tamper arrangement |
| 11, 11' | anti-tamper device |
| 12 | socket |
| 13 | opening |
| 14 | edge region |
| 15 | side face |
| 16, 16' | actuation portion |
| 17, 17' | mounting portion |
| 18 | sealing section |
| 19 | activation section |
| 20 | sealing element |
| 21 | wire |
| 22 | seal |
| 23, 23' | guideway |
| 24, 24' | through-hole |
| 25 | passages |
| 26, 26' | shaft |
| 27, 27' | mounting means |
| 28 | latching element |
| 29 | actuating element |
| 29' | recess |
| 30 | counter latching element |
| 31 | holding surface |
| 32 | bevel |
| 33 | retaining surface |
| 34 | lead-in chamfer |
| 35 | annular narrowing |
| 36 | gasket |
| 37 | inner circumference |
| 38, 38' | predetermined breaking zone |
| 39 | cylindrical portion |
| 40, 40' | leg |
| 41 | yoke |
| 42 | blocking member |
| 43 | guide surface |
| 44 | apex |
| 45, 45 | first aperture |
| 46, 46' | lead-in area |
| 47, 47' | supporting area |
| 48, 48' | wall portion |
| 49 | actuation face |
| 50 | engagement element |
| 51, 51' | second aperture |
| 52 | lateral recess |
| 53 | actuating member |
| 54 | flat section |
| 55 | lateral wall |
| $F_B$ | breaking force |
| $F_R$ | retention force |
| I | insertion direction |
| L | longitudinal axis |
| P | securing position |
| R | rotational axis |
| S | sealed state |
| X | longitudinal direction |
| Y | transverse direction |
| Z | height direction |
| α | first guiding angle |

-continued

| Reference Signs | |
|---|---|
| β | second guiding angle |
| γ | holding angle |

The invention claimed is:

1. An anti-tamper device for a utility meter, in particular for an enclosure thereof, providing a guideway for a sealing element, wherein in a sealed state of the utility meter, at least a section of the sealing element extends along the guideway, wherein the guideway is provided with a predetermined breaking zone configured to break when the sealing element exerts a predefined breaking force onto the anti-tamper device, wherein the anti-tamper device is configured to be attached to the utility meter in a securing position of the anti-tamper device and wherein a predefined retention force with which the anti-tamper device withstands removal from the securing position is greater than the predefined breaking force.

2. The anti-tamper device according to claim 1, wherein a mounting portion is configured to be brought into engagement with the utility meter in the securing position.

3. The anti-tamper device according to claim 2, wherein the mounting portion extends away from the predetermined breaking zone.

4. The anti-tamper device according to claim 2, wherein the mounting portion provides at least one holding surface at least partly extending under an acute holding angle with respect to a longitudinal axis of the mounting portion.

5. The anti-tamper device according to claim 2, wherein the mounting portion provides a latching element configured to snap behind a counter latching element provided at the utility meter in the sealed state.

6. The anti-tamper device according to claim 1, wherein the guideway has a lead-in area for leading the sealing element towards the predetermined breaking zone.

7. The anti-tamper device according to claim 1, wherein an apex formed along the guideway at least in part forms the predetermined breaking zone.

8. The anti-tamper device according to claim 1, wherein at least in part, the predetermined breaking zone is arranged in a wall portion of the anti-tamper device.

9. The anti-tamper device according to claim 1, wherein at least a part of the guideway is formed in an actuating portion of the anti-tamper device.

10. The anti-tamper device according to claim 1, wherein at least a part of the guideway is associated to an actuation face of the anti-tamper device.

11. The anti-tamper device according to claim 1, wherein at least a part of the guideway is formed as a through-hole extending through the anti-tamper device.

12. An enclosure for a utility meter comprising a socket configured for receiving an anti-tamper device according to claim 1.

13. A utility meter comprising an anti-tamper device according to claim 1.

* * * * *